(12) United States Patent
Kawai

(10) Patent No.: US 7,659,507 B2
(45) Date of Patent: Feb. 9, 2010

(54) AUTOMATIC METHOD OF AXIAL ADJUSTMENTS IN ELECTRON BEAM SYSTEM

(75) Inventor: Shuji Kawai, Tokyo (JP)

(73) Assignee: Jeol Ltd., Tokyo (JP)

( * ) Notice: Subject to any disclaimer, the term of this patent is extended or adjusted under 35 U.S.C. 154(b) by 371 days.

(21) Appl. No.: 11/862,717

(22) Filed: Sep. 27, 2007

(65) Prior Publication Data

US 2008/0078943 A1 Apr. 3, 2008

(51) Int. Cl.
*H01J 37/153* (2006.01)
*H01J 37/28* (2006.01)

(52) U.S. Cl. .................. 250/307; 250/310; 250/396 R; 250/398

(58) Field of Classification Search .................. 250/307, 250/310, 396 R, 398
See application file for complete search history.

(56) References Cited

U.S. PATENT DOCUMENTS 6,723,997 B2 *  4/2004  Matsuya et al. ......... 250/396 R
6,852,983 B2     2/2005  Matsuya et al.
6,858,844 B2 *  2/2005  Zach ........................ 250/310
7,355,175 B2 *  4/2008  Honda et al. ............. 250/310
7,375,323 B2 *  5/2008  Kawasaki et al. ......... 250/306

OTHER PUBLICATIONS

Von H. Rose, Optik 33, No. 1, pp. 1-24 (1971).
J. Zach, "Design of a High-Resolution Low-Voltage Scanning Electron Microscope," Optik 83, No. 1, pp. 30-40 (1989).

* cited by examiner

*Primary Examiner*—Jack I Berman
(74) *Attorney, Agent, or Firm*—The Webb Law Firm

(57) ABSTRACT

Axial adjustments of an aberration corrector are made roughly. Whenever plural values of voltage are applied to an electrode in the first stage of the corrector, a different value of voltage is applied to the electrodes in the stage whose center is passed through by the reference orbit in the aberration corrector. At this time, a scanning deflector scans the electron beam over a specimen, producing a scanned image signal. Based on the scanned image signal, the amounts of positional deviations of the image are calculated. Based on the calculated amounts of positional deviations and on the voltages applied to the electrode in the first stage, an optimum value of voltage is calculated and fed back to the electrode in the first stage of the corrector.

9 Claims, 7 Drawing Sheets

AUTOMATIC METHOD OF AXIAL ADJUSTMENTS IN ELECTRON BEAM SYSTEM

BACKGROUND OF THE INVENTION

1. Field of the Invention

The present invention relates to an automatic method of axial adjustments for use in an electron beam system, such as an electron microscope equipped with an aberration corrector.

2. Description of Related Art

One of the most important factors in deriving an image by a scanning electron microscope is resolution. Resolution is an index indicating the distance between two points that are discernible within a space or object. Improvement of resolution is the eternal theme in electron microscopy, as well as in scanning electron microscopy. One method of improving resolution is to shorten the distance (working distance) between the objective lens and the specimen. Another method consists of reducing various aberrations.

The aberrations include diffraction aberration, spherical aberration, and chromatic aberration. Of these aberrations, the diffraction aberration can be reduced by increasing the angular aperture. Furthermore, the spherical aberration and chromatic aberration can be reduced by improvements of electron optics. In recent years, various methods have been developed.

For example, a technique of reducing or correcting spherical and chromatic aberrations by incorporating an aberration corrector into the electron optical system has been proposed and is almost put into practical use. A proposed method for use in such an aberration corrector consists of correcting chromatic aberration by means of an electrostatic quadrupole lens and a magnetic quadrupole lens and correcting spherical aberration by means of four stages of electrostatic octopole lenses. The principle of this correction of aberrations is described in detail, for example, by H. Rose in Optik 33, Heft 1, 1-24 (1971) and by J. Zach in Optic 83, No. 1, 30-40 (1989).

Another known aberration corrector is made up of four stages of electrostatic quadrupole lenses, two stages of magnetic quadrupole lenses for superimposing a magnetic potential distribution analogous to the electric potential distribution created by the central two stages of the four stages of electrostatic quadrupole lenses, and four stages of electrostatic octopole lenses for superimposing an octopole electric potential on the electric potential distribution created by the four stages of electrostatic quadrupole lenses (for example, U.S. Pat. No. 6,852,983, paragraphs 0023-0027 and FIG. 3).

One example of aberration corrector is now described briefly. FIG. 1 shows a part of the electron optical system of an electron beam system equipped with an aberration corrector.

For example, the aberration corrector, indicated by 40, is made up of four stages of electrostatic quadrupole lenses 1, 2, 3, 4, two stages of magnetic quadrupole lenses 5, 6 for superimposing a magnetic potential distribution analogous to the electric potential distribution created by the two central stages of electrostatic quadrupole lenses 2, 3 out of the four stages of electrostatic quadrupole lenses, four stages of electrostatic octopole lenses 7, 8, 9, 10 for superimposing an octopole electric potential on the electric potential distribution created by the four stages of electrostatic quadrupole lenses, and four stages of electrostatic dipole lenses 11, 12, 13, 14 for superimposing a dipole electric potential on the electric potential distribution created by the four stages of electrostatic quadrupole lenses. The electron beam transmitted through the aberration corrector 40 is focused onto a specimen 16 by an objective lens 15.

Reference orbits extending in the X- and Y-directions, respectively, are indicated by Rx and Ry, and are paraxial orbits that are assumed where there is no aberration. The quadrupole lens 1 causes the Y-direction reference orbit Ry to pass through the center of the quadrupole lens 2. The quadrupole lens 2 causes the X-direction reference orbit Rx to pass through the center of the quadrupole lens 3. Finally, the quadrupole lenses 3, 4 and objective lens 15 cause the orbit of the electron beam to be focused onto the specimen 16. Spherical and chromatic aberrations are corrected by this aberration corrector as follows.

With respect to correction of the chromatic aberration, chromatic aberration in the X-direction in the whole lens system is corrected to zero by adjusting the electric potential $V_2$ at the electrostatic quadrupole lens 2 and the excitation $B_2$ at the magnetic quadrupole lens 5 in such a way that the reference orbits are kept unchanged. Similarly, chromatic aberration in the Y-direction in the whole lens system is corrected to zero by adjusting the electric potential $V_3$ at the electrostatic quadrupole lens 3 and the excitation $B_3$ at the magnetic quadrupole lens 6 in such a way that the reference orbits are kept unchanged.

The spherical aberration is corrected after the correction of the chromatic aberration. In particular, the spherical aberration in the X-direction in the whole lens system is corrected to zero by the electric potential $V_2$ at the electrostatic octopole lens 8. The spherical aberration in the Y-direction is corrected to zero by the electric potential $V_3$ at the electrostatic octopole lens 9. Spherical aberration in the combined direction of the X- and Y-directions is corrected to zero by the electrostatic octopole lenses 7 and 10. The accuracy can be improved by repeatedly carrying out the above-described operations.

In order to focus the electron beam onto the specimen 16 reliably, mutual adjustments of the reference orbits in the X- and Y-directions are necessary. For this purpose, axial adjustments of the whole aberration corrector are necessary. However, such axial adjustments are made differently by each different operator.

Furthermore, such axial adjustments are not being constantly made. Consequently, a considerably long time is taken until a high-resolution image is obtained. In addition, axial adjustments of such an aberration corrector are complex to perform. Often, the axial adjustments are made unsuccessfully.

SUMMARY OF THE INVENTION

The present invention has been made to solve the foregoing problems. It is an object of the present invention to provide a method of automatically and roughly making axial adjustments in an electron beam system before the axial adjustments are made finely.

An automatic method of axial adjustments according to the present invention is carried out in an electron beam system having: an electron beam source for producing an electron beam; a system of condenser lenses for focusing the electron beam produced from the electron beam source; an objective lens for focusing the electron beam onto a specimen; deflector lenses for scanning the electron beam over the specimen; aberration corrector having plural stages of combinations of electric or magnetic multipole lenses and electric-magnetic compound multipole lenses and acting to correct aberrations in the electron beam; a control power supply for supplying electric signals to the lenses; detector for detecting electrons emanating from the specimen in response to the scanning; storage memory for storing an output signal from the detector as data about a scanned image; positional deviation computation device for calculating positional deviations of the image based on the data about the scanned image; and controller for calculating an optimum value of electric signal at which an orbit of the electron beam in the aberration corrector is brought into coincidence with a reference orbit based on the calculated positional deviations and sending an instruction to the control power supply such that an electric signal based on the calculated value is supplied to a multipole lens in the first stage of the aberration corrector. The automatic method of axial adjustments comprises the steps of: calculating positional deviations of the image from scanned image data obtained whenever a different intensity of electric signal is supplied to multipole lenses in a stage which is included in the plural stages and whose center is passed through by the reference orbit when plural different electric signals are successively supplied to the multipole lens in the first stage; calculating an optimum value of electric signal based on the electric signals supplied to the multipole lens in the first stage and on the calculated positional deviations; and supplying the optimum value of electric signal to the multipole lens in the first stage.

Another automatic method of axial adjustments according to the present invention is carried out in an electron beam system having: an electron beam source for producing an electron beam; a system of condenser lenses for focusing the electron beam produced from the electron beam source; an objective lens for focusing the electron beam onto a specimen; an aperture disposed between the system of condenser lenses and the objective lens; condenser lens-correcting deflector lenses disposed above the aperture and acting to adjust an optical axis of the electron beam relative to a center axis of the system of condenser lenses and to scan the electron beam over the aperture; beam-deflecting lenses for scanning the electron beam over the specimen; aberration corrector having plural stages of combinations of electric or magnetic multipole lenses and electric-magnetic compound multipole lenses and acting to correct aberrations in the electron beam; a control power supply for supplying electric signals to the lenses; detector for detecting electrons emanating from the specimen in response to the scanning; storage memory for storing an output signal from the detector as data about a scanned image; positional deviation computation device for calculating positional deviations of the image based on the data about the scanned image; and controller for calculating an optimum value of electric signal at which an orbit of the electron beam in the aberration corrector is brought into coincidence with a reference orbit based on the calculated positional deviations and sending an instruction to the control power supply such that an electric signal based on the calculated value is supplied to a multipole lens in the first stage of the aberration corrector. The automatic method of axial adjustments comprises the steps of: calculating positional deviations of the image from scanned image data obtained whenever different intensities of electric signals are supplied to multipole lenses in a stage which is included in the plural stages and whose center is passed through by the reference orbit when plural different electric signals are successively supplied to the multipole lens in the first stage; calculating an optimum value of electric signal based on the electric signals supplied to the multipole lens in the first stage and on the calculated positional deviations; calculating positional deviations of the image from scanned image data obtained whenever different intensities of electric signals are successively supplied to the condenser lens-correcting deflector lenses and scanning the electron beam over the aperture; calculating an optimum value of electric signal based on the electric signals supplied to the condenser lens-correcting deflector lenses and on the calculated positional deviations; and supplying the calculated optimum value of electric signal to the condenser lens-correcting deflector lenses.

A further automatic method of axial adjustments according to the present invention is carried out in an electron beam system having: an electron beam source for producing an electron beam; a system of condenser lenses for focusing the electron beam produced from the electron beam source; an objective lens for focusing the electron beam onto a specimen; an objective lens-correcting deflector lens for adjusting an optical axis of the electron beam relative to a center axis of the objective lens; beam-deflecting lenses for scanning the electron beam over the specimen; aberration corrector having plural stages of combinations of electric or magnetic multipole lenses and electric-magnetic compound multipole lenses and acting to correct aberrations in the electron beam; a control power supply for supplying electric signals to the lenses; detector for detecting electrons emanating from the specimen in response to the scanning; storage memory for storing an output signal from the detector as data about a scanned image; positional deviation computation device for calculating positional deviations of the image based on the data about the scanned image; and controller for calculating an optimum value of electric signal at which an orbit of the electron beam in the aberration corrector is brought into coincidence with a reference orbit based on the calculated positional deviations and sending an instruction to the control power supply such that an electric signal based on the calculated value is supplied to a multipole lens in the first stage of the aberration corrector. The automatic method of axial adjustments comprises the steps of: calculating positional deviations of the image from scanned image data obtained whenever different intensities of electric signals are supplied to multipole lenses in a stage which is included in the plural stages and whose center is passed through by the reference orbit when plural different electric signals are successively supplied to the multipole lens in the first stage; calculating an optimum value of electric signal based on the electric signals supplied to the multipole lens in the first stage and on the calculated positional deviations; supplying the optimum value of electric signal to the multipole lens in the first stage; calculating positional deviations of the image from scanned image data obtained whenever an electric signal for underfocusing and an electric signal for overfocusing are successively supplied to the objective lens when plural different electric signals are successively supplied to the objective lens-correcting deflector lens; and calculating an optimum value of electric signal based on the electric signals supplied to the objective lens-correcting deflector lens and on the calculated positional deviations and supplying the calculated optimum value of electric signal to the objective lens-correcting deflector lens.

An additional automatic method of axial adjustments according to the present invention is carried out in an electron beam system having: an electron beam source for producing an electron beam; a system of condenser lenses for focusing the electron beam produced from the electron beam source; an objective lens for focusing the electron beam onto a specimen; an aperture disposed between the system of condenser lenses and the objective lens; condenser lens-correcting deflector lenses disposed above the aperture and acting to adjust an optical axis of the electron beam relative to a center axis of the system of condenser lenses and to scan the electron beam over the aperture; an objective lens-correcting deflector lens for adjusting the optical axis of the electron beam relative to the center axis of the objective lens; beam-deflecting lenses for scanning the electron beam over the specimen; aberration corrector having plural stages of combinations of electric or magnetic multipole lenses and electric-magnetic compound multipole lenses and acting to correct aberrations in the electron beam; a control power supply for supplying electric signals to the lenses; detector for detecting electrons emanating from the specimen in response to the scanning; storage memory for storing an output signal from the detector as data about a scanned image; positional deviation computation device for calculating positional deviations of the image based on the data about the scanned image; and controller for calculating an optimum value of electric signal at which an orbit of the electron beam in the aberration corrector is brought into coincidence with a reference orbit based on the calculated positional deviations and sending an instruction to the control power supply such that an electric signal based on the calculated value is supplied to a multipole lens in the first stage of the aberration corrector. The automatic method of axial adjustments comprises the steps of: calculating positional deviations of the image from scanned image data obtained whenever different intensities of electric signals are supplied to the multipole lenses in a stage which is included in the plural stages and whose center is passed through by the reference orbit when plural different electric signals are successively supplied to the multipole lens in the first stage; calculating an optimum value of electric signal based on the electric signals supplied to the multipole lens in the first stage and on the calculated positional deviations; supplying the optimum value of electric signal to the multipole lens in the first stage; calculating positional deviations of the image from scanned image data obtained whenever different intensities of electric signals are successively supplied to the condenser lens-correcting deflector lenses and the electron beam is scanned over the aperture; calculating an optimum value of electric signal based on the electric signals supplied to the condenser lens-correcting deflector lenses and on the calculated positional deviations and supplying the calculated optimum value of electric signal to the condenser lens-correcting deflector lenses; calculating positional deviations of the image from scanned image data obtained when an electric signal for underfocusing and an electric signal for overfocusing are successively supplied to the objective lens whenever plural different electric signals are successively supplied to the objective lens-correcting deflector lens; and calculating an optimum value of electric signal based on the electric signals supplied to the objective lens-correcting deflector lens and on the calculated positional deviations and supplying the calculated optimum value of electric signal to the objective lens-correcting deflector lens.

According to the present invention, axial adjustments of an aberration corrector can be made automatically and, therefore, the axial adjustments of the corrector can be carried out without relying on the operator's skill level.

Furthermore, since axial adjustments of the aberration corrector can be made automatically, i.e., easily, unsuccessful axial adjustments of the corrector occur less frequently.

In addition, because of automated axial adjustments, axial adjustments of the aberration corrector can be made routinely. Consequently, it is possible to obtain a high-resolution image in a short time.

Other objects and features of the invention will appear in the course of the description thereof, which follows.

DESCRIPTION OF THE PREFERRED EMBODIMENTS

Embodiments of the present invention are hereinafter described with reference to the accompanying drawings.

Figure 1:
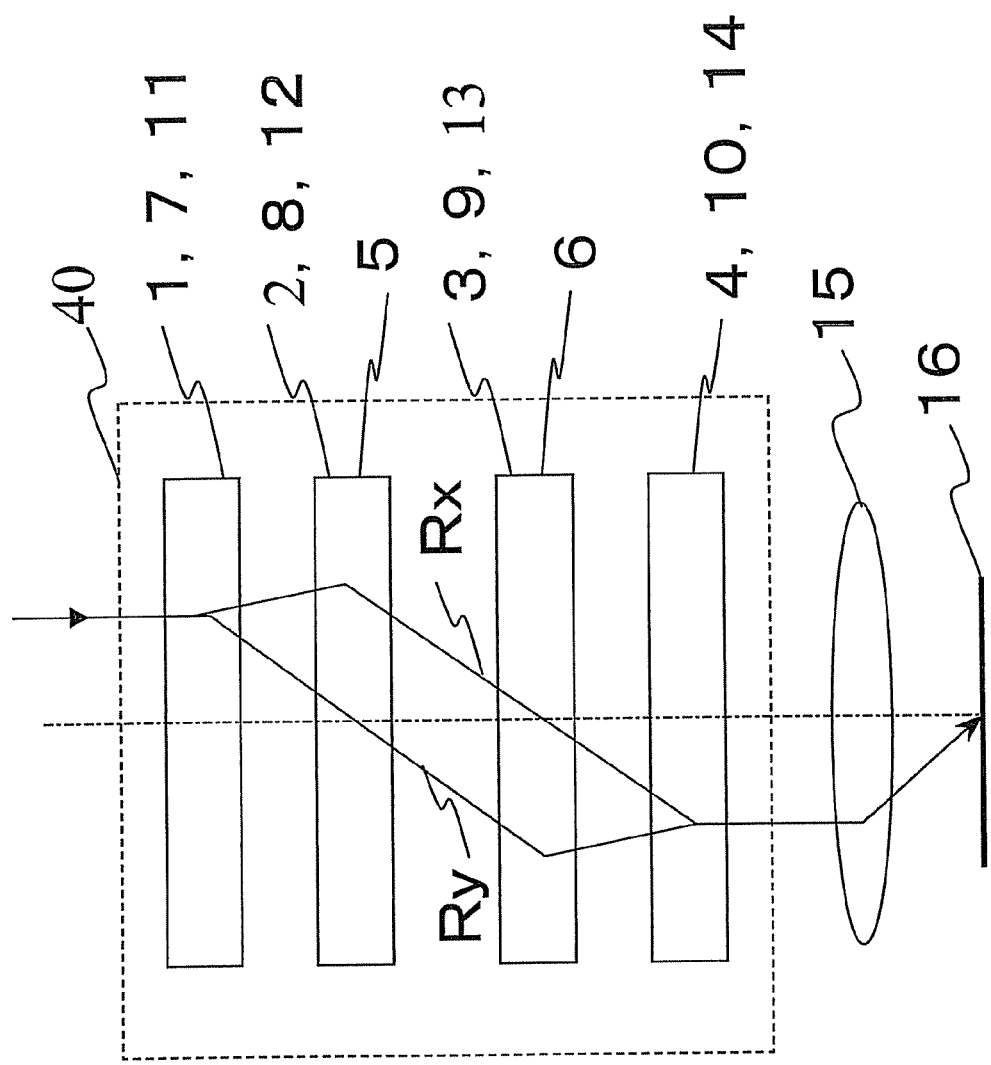
FIG. 1 is a schematic diagram of one example of aberration corrector.
Figure 2:
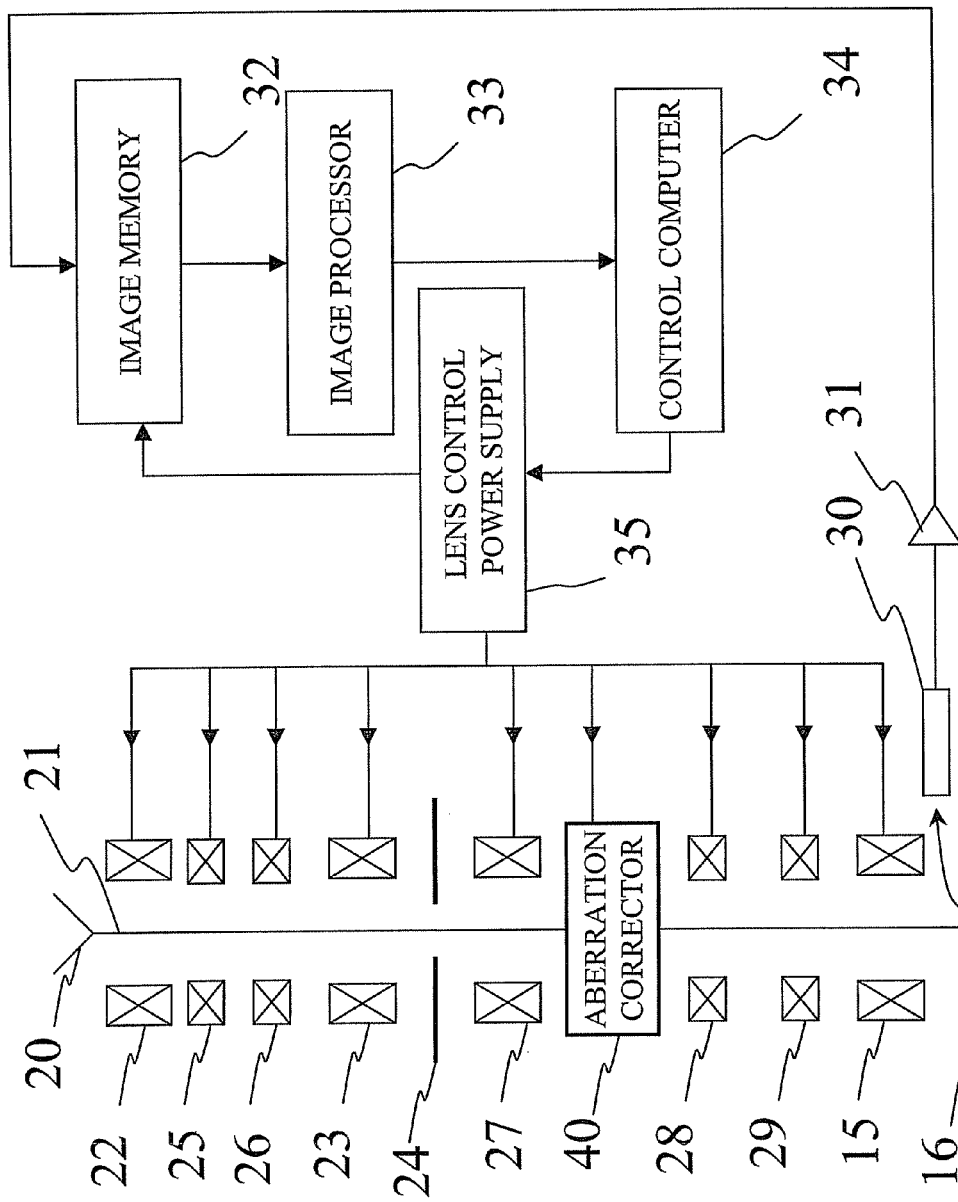
FIG. 2 is a schematic block diagram of a scanning electron microscope equipped with an aberration corrector.

FIG. 2 schematically shows one example of a scanning electron microscope equipped with an aberration corrector. Like components are indicated by like reference numerals in both FIGS. 1 and 2.

In FIG. 2, the scanning electron microscope has an electron gun 20 emitting an electron beam 21. An upper condenser lens 22 and a lower condenser lens 23 focus the electron beam emitted from the electron gun 20 onto an objective aperture 24.

An upper condenser lens-correcting deflector lens 25 and a lower condenser lens-correcting deflector lens 26 are located between the upper condenser lens 22 and the lower condenser lens 23 and contribute to adjustment of the optical axis of the electron beam 21 and to scanning of the electron beam over the objective aperture 24.

An angular aperture control lens 27 cooperates with the objective aperture 24 to control the angular aperture of the electron probe incident on the specimen 16.

A scanning deflector lens 28 scans the electron beam over the specimen, the beam being focused on the specimen 16. An objective lens-correcting deflector lens 29 adjusts the optical axis of the electron beam (i.e., the center axis of the beam) in the objective lens 15. Secondary electrons or backscattered electrons emanating from the specimen 16 in response to the scanning of the beam 21 are detected by a detector 30. An amplifier 31 is connected with the detector 30.

An image memory 32 stores the signal from the detector 30 as an image signal. An image processor 33 reads image data from the image memory 32 and performs given image processing or calculates the amounts of positional deviations. A control computer 34 issues various instructions, performs calculations, and stores numerical values. A lens control power supply 35 supplies appropriate voltages or currents to the lenses according to an instruction from the control computer 34.

In the scanning electron microscope constructed in this way, the electron beam 21 produced from the electron gun 20 is focused onto the objective aperture 24 by the upper condenser lens 22 and lower condenser lens 23. The beam transmitted through the objective aperture passes through the angular aperture control lens 27 and the aberration corrector 40 and is focused onto the specimen 16 by the objective lens 15.

Under this condition, the axes of the condenser lenses 22 and 23 are first adjusted. These axial adjustments are known as "axial adjustments for CL (condenser lens) shifts" and "axial adjustments for CL (condenser lens) tilts," respectively.

First, axial adjustments for CL shifts are described. In the axial adjustments for CL shifts, the following adjustment is made such that the center of the electron beam 21 passes through the center of the objective aperture 24.

Plural CL shift values (deflection values) stored in the internal memory of the control computer 34 are successively supplied from the lens control power supply 35 to the upper and lower condenser lens-correcting deflector lenses 25 and 26, respectively, under instructions from the computer. Correspondingly, the electron beam focused on the objective aperture 24 raster-scans the objective aperture.

Figure 3:
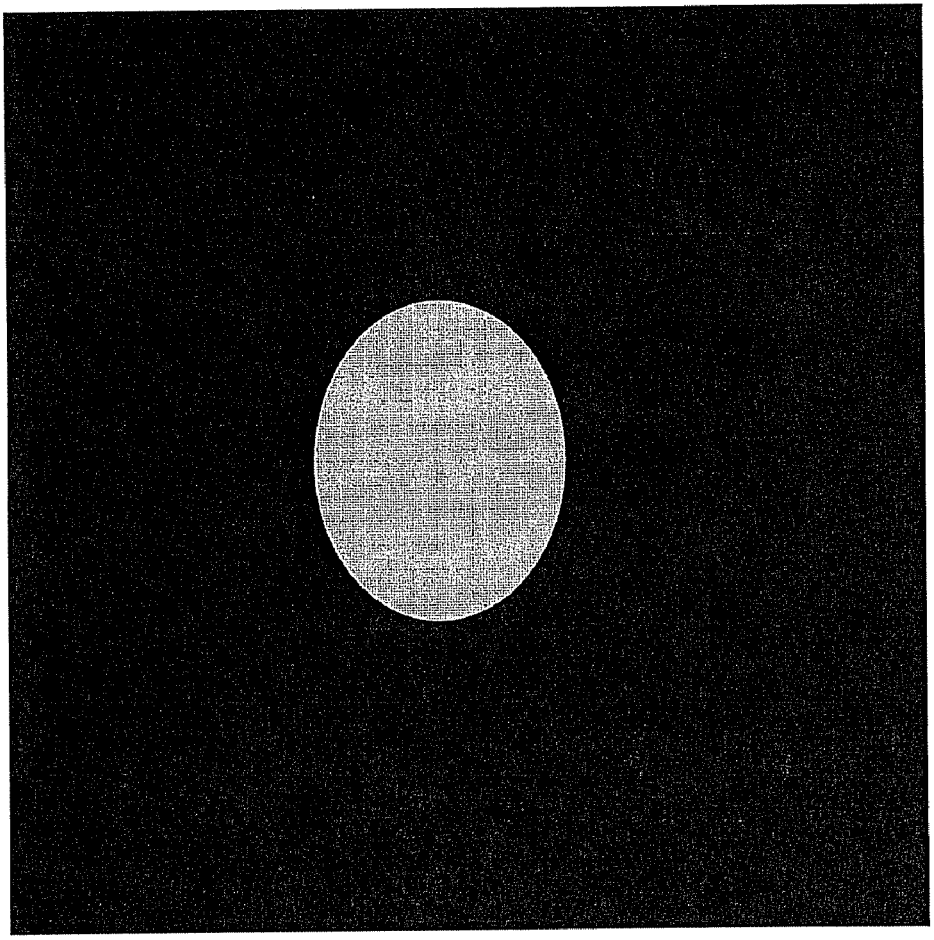
FIG. 3 shows an example of a scanned image.

Secondary electrons or backscattered electrons released from the specimen 16 by the scanning are detected by the detector 30. Output signals from the detector are successively stored as image signals in the image memory 32. An image indicated by the image signals is a frame of image of alignment pattern (ALP) (see FIG. 3). In the frame of image of ALP, a certain image is referred to as an ALP image (central image in FIG. 3).

The ALP image signal is read into the image processor 33, which, in turn, calculates the values of coordinates of the center of gravity of brightness of each ALP image based on the ALP image signals.

The values of the coordinates of the center of gravity of the brightness of the ALP image obtained when the center of the objective aperture 24 was coincident with the center axis of the electron beam are previously stored as the coordinate values of the center of gravity of a reference brightness of the ALP image (reference ALP image) in the image memory 32. The coordinate values of the center of gravity of the reference brightness are read into the image processor 33.

Figure 4:
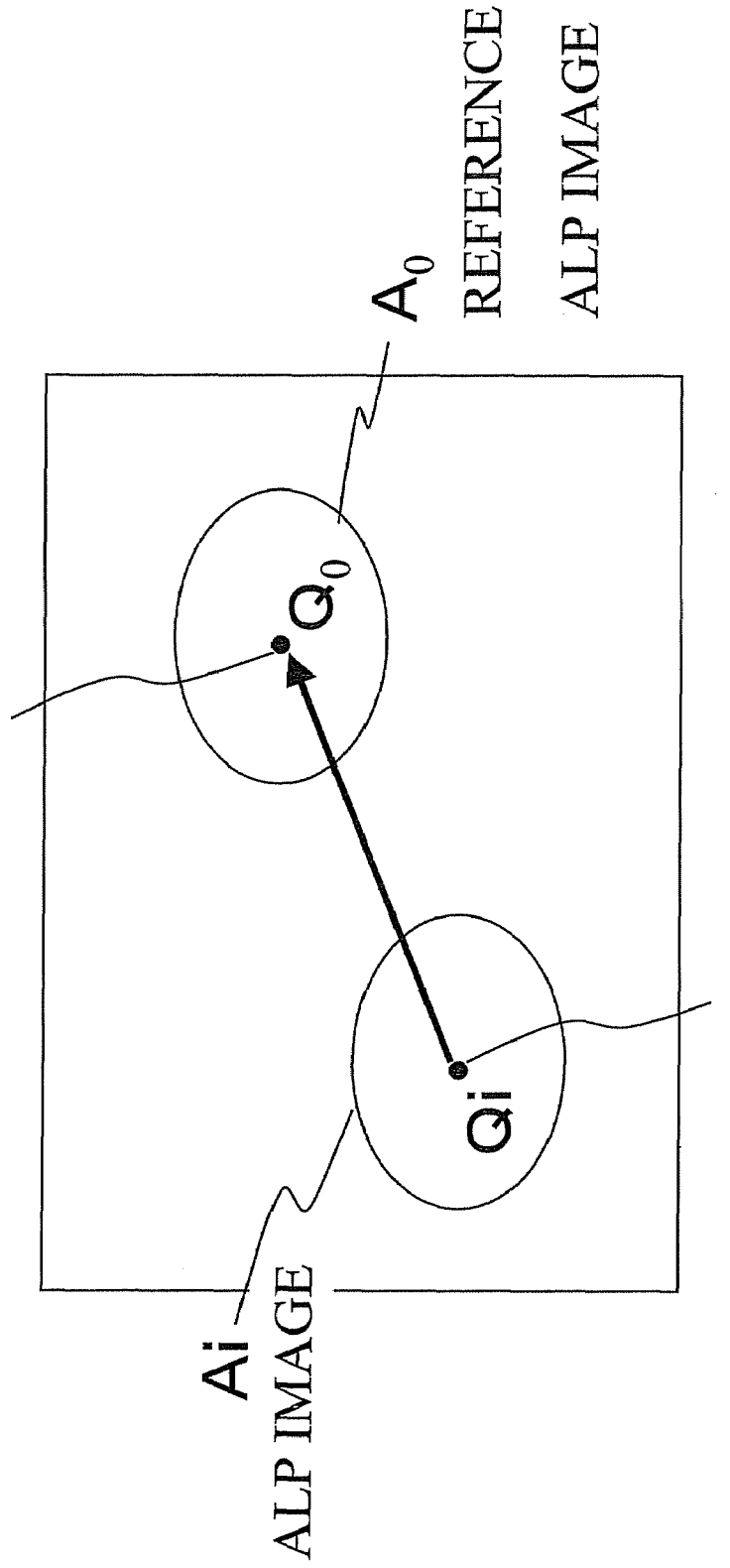
FIG. 4 is a diagram illustrating an axial adjustment for a CL (condenser lens) shift.

The image processor successively calculates each distance between the center of gravity of the brightness of the ALP image ($A_i$ in FIG. 4) and the center of gravity of the reference brightness, based on the calculated coordinate values of the center of gravity ($Q_i$ in FIG. 4) of the brightness of the ALP image ($A_i$ in FIG. 4) and the coordinate values of the center of gravity ($Q_0$ in the ALP image $A_0$ in FIG. 4). The calculated values are the amounts of positional deviations for the values of CL shift.

The calculated amounts of positional deviations are sent to the control computer 34, which, in turn, calculates an optimum value of CL shift from the relationship between the CL shift amounts and the calculated amounts of positional deviations.

Figure 5:
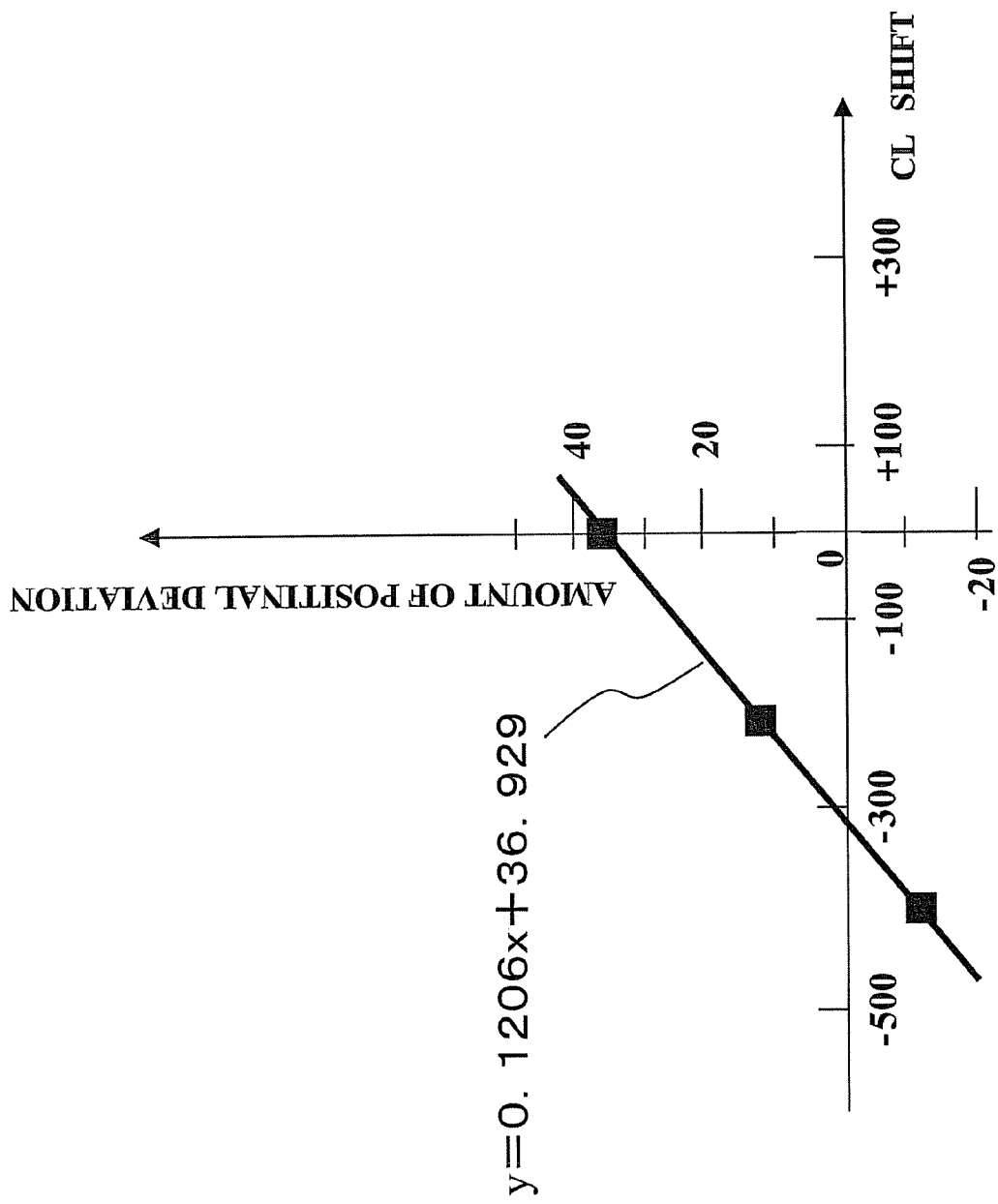
FIG. 5 is a graph illustrating an axial adjustment for a CL shift.

FIG. 5 shows the relationship between the amount of CL shift and the amount of positional deviation. The amount of CL shift is plotted on the horizontal axis. The amount of positional deviation is plotted on the vertical axis.

A straight line as shown is obtained by plotting the amounts of positional deviations calculated for the values of CL shift and connecting the plot points. The straight line can be expressed by a linear function, such as $y=0.1206x+36.929$.

Axial adjustment for a CL shift is to make an adjustment such that the electron beam 21 passes through the center of the objective aperture 24. When the amount of positional deviation is zero, the beam 21 passes through the center of the aperture 24 and so the value of x (−306) assumed when y=0 is an optimum value of the value of CL shift in the linear function $y=0.1206x+36.929$.

The optimum value of the CL shift value calculated in this way is then sent from the control computer 34 to the lens control power supply 35. The lens control power supply supplies excitation currents based on the optimum value to the upper and lower condenser lens-correcting deflector lenses 25 and 26, respectively.

In practice, the values of CL shift consist of a value in the X-direction and a value in the Y-direction. Optimum values of CL shift are found for both directions. The found optimum value in the X-direction must be supplied to the X-direction deflector lenses of the upper and lower condenser lens-correcting deflector lenses 25 and 26, respectively. The found optimum value in the Y-direction must be supplied to the Y-direction deflector lenses of the condenser lens-correcting deflector lenses 25 and 26. The operation itself is the same although the direction is different. For the sake of illustration, in the description, no directional components are indicated. In this way, axial adjustments for CL shifts are ended.

Axial adjustments for CL tilt are next described. In the axial adjustments for CL tilt, the following adjustments are made to bring the optical axis of the electron beam 21 into agreement with the optical axis of the lower condenser lens 23. That is, the beam 21 is so adjusted that it passes through the center of the lower condenser lens 23.

CL tilt values (deflection values) stored in the memory within the control computer 34 are successively sent to the upper and lower condenser lens-correcting deflector lenses 25 and 26, respectively, from the lens control power supply 35 under instructions from the control computer. Whenever each CL tilt value is supplied, the following operations a-c are performed.

a. The lens control power supply 35 sends a strong excitation current to the lower condenser lens 23 under an instruction from the control computer 34. The scanning deflector lens 28 scans the electron beam over the specimen 16. Secondary electrons emanating from the specimen in response to the scanning are detected by the detector 30. The output signal from the detector is stored as a first scanned image signal into the image memory 32.

b. The lens control power supply 35 sends a weak excitation current to the lower condenser lens 23 under an instruction from the control computer 34. The scanning deflector lens 28 scans the beam over the specimen 16. Secondary electrons produced from the specimen in response to the scanning are detected by the detector 30. The output signal from the detector is stored as a second scanned image signal into the image memory 32.

c. The image processor 33 reads in the first and second scanned image signals from the image memory 32 and calculates the amount of positional deviation of the common pattern in the scanned images.

The calculated amounts of positional deviations are sent to the control computer 34, which, in turn, calculates optimum values of CL tilt values based on the CL tilt values and on the calculated amounts of positional deviations.

Figure 6:
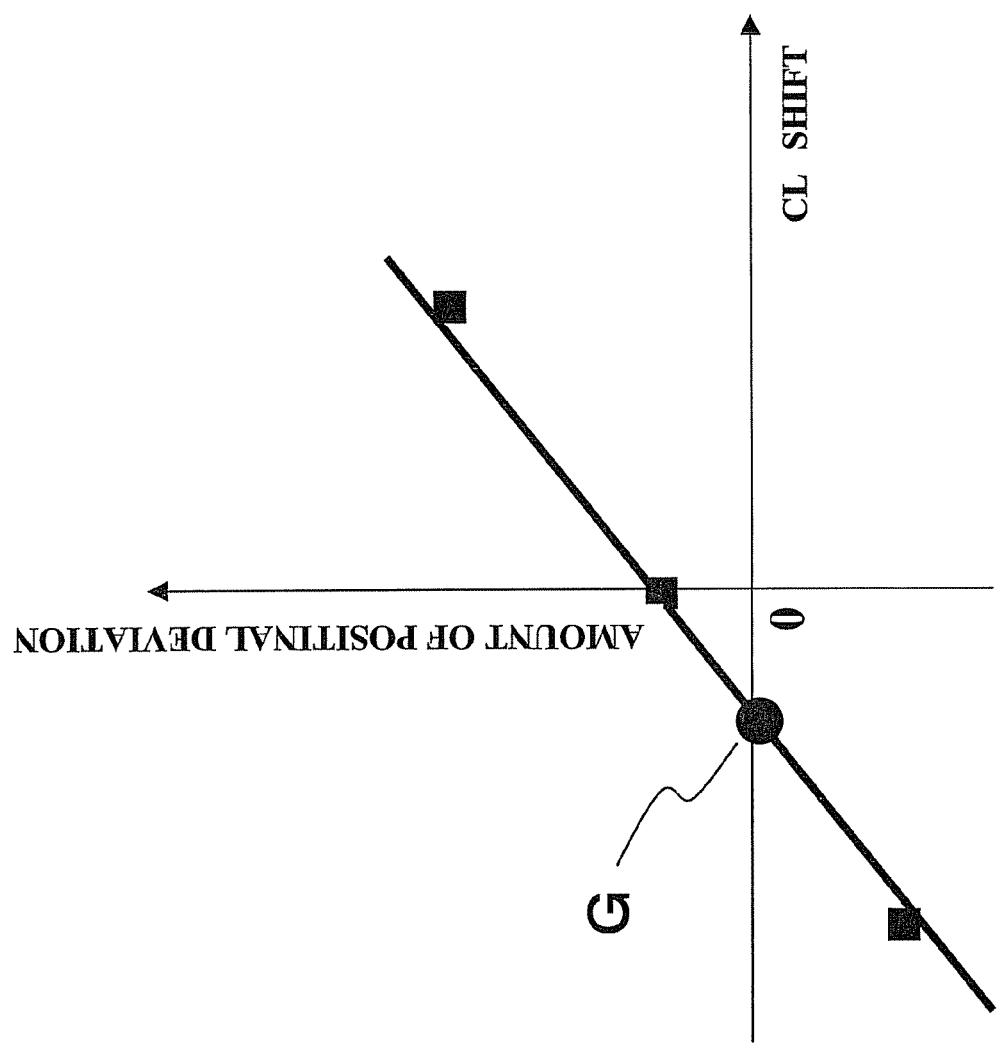
FIG. 6 is a graph illustrating an axial adjustment for a CL tilt.

The calculation of the optimum values is described in somewhat further detail. FIG. 6 shows the relationship between each CL tilt value and positional deviation. The CL tilt value is plotted on the horizontal axis. The amount of the positional deviation is plotted on the vertical axis.

A straight line as shown is obtained by plotting the amounts of positional deviations calculated for the values of CL shift and connecting the plot points. The straight line is given by a linear function. That is, the amount of positional deviation can be regarded as a linear function of the CL tilt value.

Axial adjustment for CL tilt is to make an adjustment such that the electron beam 21 passes through the center of the lower condenser lens 23. When the amount of positional deviation is 0, the beam 21 passes through the center of the lower condenser lens 23 and so the amount of positional deviation is 0 at point G in FIG. 6. Consequently, the CL tilt value produced at that time is an optimum value.

The optimum value of CL tilt value calculated in this way is then sent from the control computer 34 to the lens control power supply 35, which, in turn, supplies an excitation current based on the optimum value to the upper and lower condenser lens-correcting deflector lenses 25 and 26, respectively. In this way, axial adjustment for the CL tilt is completed.

In practice, the values of CL shift consist of a value in the X-direction and a value in the Y-direction. Optimum values of CL tilt are found for both directions. The found optimum value in the X-direction must be supplied to the X-direction deflector lenses of the condenser lens-correcting deflector lenses 25 and 26. The found optimum value in the Y-direction must be supplied to the Y-direction deflector lenses of the condenser lens-correcting deflector lenses 25 and 26. The operation itself is the same although the direction is different. For the sake of illustration, in the description, no directional components are indicated.

Axial adjustments of the condenser lenses 22 and 23 are completed in this way by end of the axial adjustments for CL shifts and CL tilt.

Axial adjustment of the aberration corrector 40 is next described.

Axial adjustments of the aberration corrector 40 consist of adjustment for aligning the center of the X-orbit of the electron beam 21 with the center of the third stage of electrostatic quadrupole lens 3 of the aberration corrector 40 and adjustment for aligning the center of the Y-orbit of the electron beam 21 with the center of the second stage of electrostatic quadrupole lens 2 of the corrector 40.

Axial adjustment of the X-orbit is first described. Plural voltage values stored in the internal memory of the control computer 34 are successively applied to the X-direction electrode in the first stage of electrostatic dipole lens 11 from the lens control power supply under instructions from the control computer.

Whenever each of these voltages is applied, the following operations a-c are performed.

a. The lens control power supply 35 applies a high voltage to the Y-direction electrode in the third stage of electrostatic quadrupole lens 3 under an instruction from the control computer 34. The scanning deflector lens 28 scans the electron beam 21 over the specimen 16. Secondary electrons emanating from the specimen in response to the scanning are detected by the detector 30. The output signal from the detector is stored as a first scanned image signal into the image memory 32.

b. A low voltage is applied to the Y-direction electrode in the third stage of electrostatic quadrupole lens 3 from the lens control power supply 35 under an instruction from the control computer 34. The scanning deflector lens 28 scans the electron beam 21 over the specimen 16. Secondary electrons produced from the specimen in response to the scanning are detected by the detector 30. The output signal from the detector is stored as a second scanned image signal into the image memory 32.

c. The image processor 33 reads in the first and second scanned image signals from the image memory 32 and calculates the amount of positional deviation of the common pattern in the scanned images.

In the operations a and b described above, in a case where high and low voltages are applied to the third stage of electrostatic quadrupole lens 3, the voltages are applied to the Y-direction electrodes because the cross section of the electron beam in the space surrounded by the X- and Y-direction electrodes in the third stage of electrostatic quadrupole lens 3 extends along the X-direction electrode and, thus, the beam moves more sensitively to the electric field produced by the Y-direction electrode than the field produced by the X-direction electrode.

The calculated amounts of positional deviations are sent to the control computer 34, which, in turn, calculates an optimum value to be applied to the X-direction electrode in the first stage of electrostatic dipole lens 11 based on the above-described voltage values and on the amounts of positional deviations.

Figure 7:
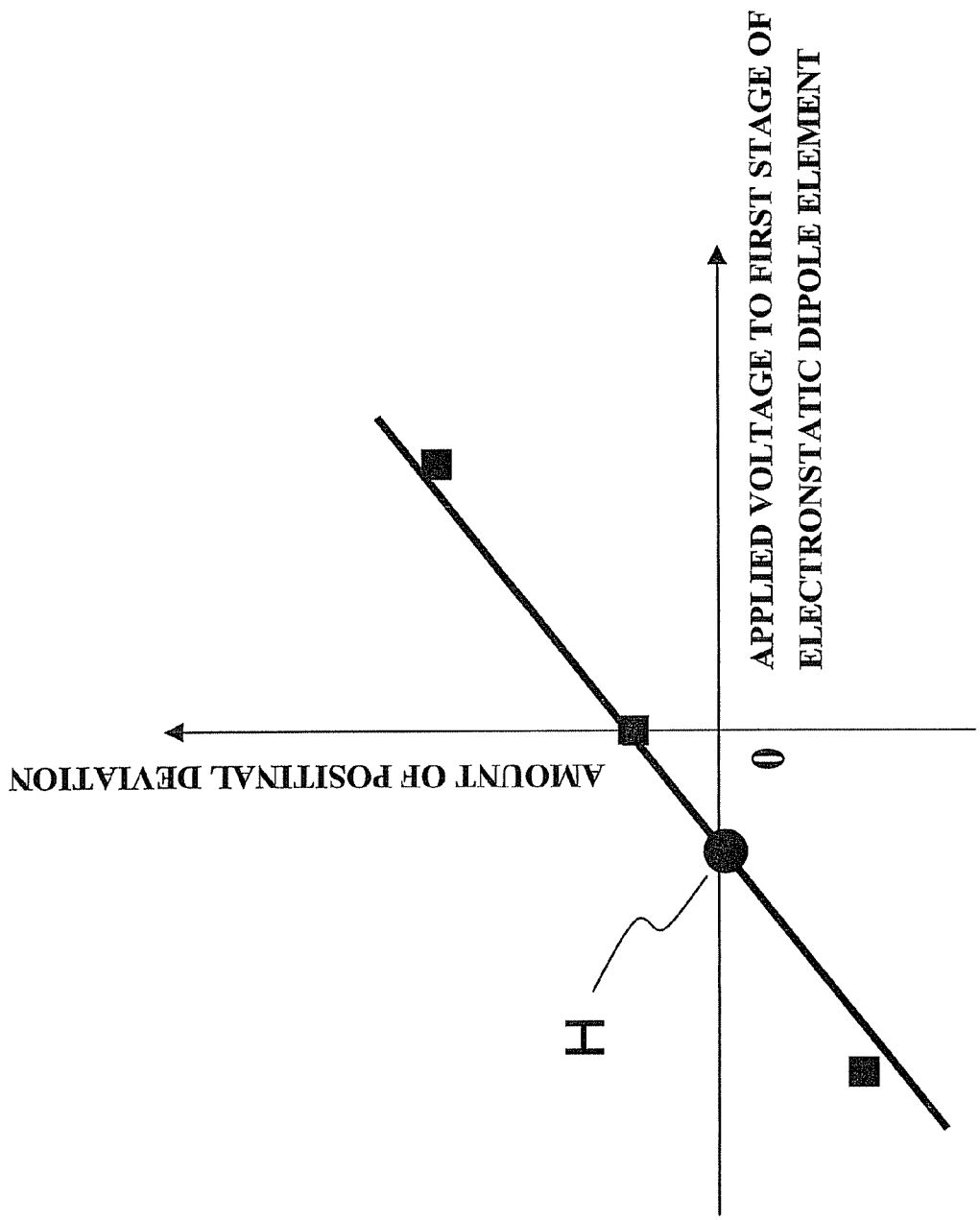
FIG. 7 is a graph illustrating axial adjustments of an aberration corrector.

The calculation of the optimum values is described in somewhat further detail. FIG. 7 shows the relationship between the voltage applied to the X-direction electrode in the first stage of electrostatic dipole lens 11 and positional deviations. The value of the applied voltage is plotted on the horizontal axis. The amount of the positional deviation is plotted on the vertical axis.

A straight line as shown is obtained by plotting the amounts of positional deviations calculated for the values of the applied voltages and connecting the plot points. The straight line is given by a linear function. That is, the amount of positional deviation can be regarded as a linear function of the value of the applied voltage.

When the amount of positional deviation is zero, the center of the X-orbit of the electron beam 21 is aligned with the center of the third stage of electrostatic quadrupole lens 3 of the aberration corrector 40. Therefore, the value of voltage at a point H where the amount of positional deviation is zero is calculated as an optimum value for the X-direction electrode in the first stage of electrostatic dipole lens 11.

The optimum value calculated in this way is then sent from the control computer 34 to the lens control power supply 35. The power supply 35 supplies a voltage signal (deflection signal) based on the incoming optimum signal to the X-direction electrode in the first stage of electrostatic dipole lens 11.

Axial adjustment of the Y-orbit is next described. Plural voltage values stored in the internal memory of the control computer 34 are successively applied to the Y-direction electrode in the first stage of electrostatic dipole element 11 from the lens control power supply under instructions from the control computer.

Whenever each of these voltages is applied, the following operations a-c are performed.

a. The lens control power supply 35 applies a high voltage to the Y-direction electrode in the second stage of electrostatic quadrupole lens 2 under an instruction from the control computer 34. The scanning deflector lens 28 scans the electron beam 21 over the specimen 16. Secondary electrons emanating from the specimen in response to the scanning are detected by the detector 30. The output signal from the detector is stored as a first scanned image signal into the image memory 32.

b. A low voltage is applied to the Y-direction electrode in the second stage of electrostatic quadrupole lens 2 from the lens control power supply 35 under an instruction from the control computer 34. The scanning deflector lens 28 scans the beam 21 over the specimen 16. Secondary electrons produced from the specimen in response to the scanning are detected by the detector 30. The output signal from the detector is stored as a second scanned image signal into the image memory 32.

c. The image processor 33 reads in the first and second scanned image signals from the image memory 32 and calculates the amount of the positional deviations of the common pattern in the scanned images.

In the operations a and b described above, in a case where high and low voltages are applied to the second stage of electrostatic quadrupole lens 2, the voltages are applied to the Y-direction electrode because the cross section of the electron beam in the space surrounded by the X- and Y-direction electrodes in the second stage of electrostatic quadrupole lens 2 extends along the X-direction electrode and, thus, the beam moves more sensitively to the electric field produced by the Y-direction electrode than the field produced by the X-direction electrode.

The calculated amounts of positional deviations are then sent to the control computer 34, which, in turn, calculates an optimum value of voltage to be applied to the Y-direction electrode in the first stage of electrostatic dipole lens 11 based on the voltage values and on the amounts of positional deviations. Since the method of calculating the optimum values is similar to the method of making an axial adjustment of the X-orbit, detailed description of the method of calculating the optimum values is omitted.

The optimum value calculated in this way is then sent from the control computer 34 to the lens control power supply 35. The power supply 35 supplies a voltage signal (deflection signal) based on the incoming optimum value to the Y-direction electrode in the first stage of electrostatic dipole lens 11.

Axial adjustments of the aberration corrector 40 are completed in this way by making axial adjustments of the X- and Y-orbits as described so far.

Axial adjustment of the objective lens 15 is next described. Plural intensity values (excitation current values) stored in the internal memory of the control computer 34 are successively supplied from the lens control power supply 35 to the objective lens-correcting deflector lens 29 under an instruction from the computer.

Whenever each excitation current value is supplied, the following operations a-c are performed.

a. The lens control power supply 35 supplies an excitation current, which is strong enough to underfocus the electron beam on the specimen 16, to the objective lens 15 under an instruction from the control computer 34. The scanning deflector lens 28 scans the electron beam 21 over the specimen 16. Secondary electrons emanating from the specimen in response to the scanning are detected by the detector 30. The output signal from the detector is stored as a first scanned image signal into the image memory 32.

b. The lens control power supply 35 supplies an excitation current, which is strong enough to overfocus the electron beam over the specimen 16, to the objective lens 15 under an instruction from the control computer 34. The scanning deflector lens 28 scans the electron beam 21 over the specimen 16. Secondary electrons produced from the specimen in response to the scanning are detected by the detector 30. The output signal from the detector is stored as a second scanned image signal into the image memory 32.

c. The image processor 33 reads in the first and second scanned image signals from the image memory 32 and calculates the amount of the positional deviations of the common pattern in the scanned images.

In the operations described above, as an example, let $(u_1, v_1)$, $(u_2, v_2)$, and $(u_3, v_3)$ be the values of excitation current supplied to the objective lens-correcting deflector lens 29. $u_1$, $u_2$, and $u_3$ are the values of excitation current in the X-direction. $v_1$, $v_2$, and $v_3$ are the values of excitation current in the Y-direction. Because an underfocused image signal and an overfocused image signal are obtained for each value of the excitation current, six scanned image signals are derived in total.

The image processor 33 calculates the amount of positional deviation of the common pattern within the images from the underfocused scanned image signal and overfocused scanned image signal obtained for each of the excitation current values $(u_1, v_1)$, $(u_2, v_2)$, and $(u_3, v_3)$ read in from the image memory 32. That is, the processor finds the amounts of positional deviations $(\Delta x_1, \Delta y_1)$, $(\Delta x_2, \Delta y_2)$, and $(\Delta x_3, \Delta y_3)$ of the pattern that is common to the underfocused and overfocused images at each value of the excitation current. These amounts of positional deviations can be accurately calculated by an image-processing method, such as a general image correlation technique (e.g., a pattern matching technique).

The control computer 34 calculates an optimum value of the excitation current to the objective lens-correcting deflector lens 29 according to Eq. (1), based on the values of the excitation current to the deflector lens 29 and on the amounts of positional deviations.

$$\begin{pmatrix} u \\ v \end{pmatrix} = \begin{pmatrix} a & b \\ d & e \end{pmatrix} \begin{pmatrix} \Delta x \\ \Delta y \end{pmatrix} + \begin{pmatrix} c \\ f \end{pmatrix} \quad (1)$$

Eq. (1) is an affine transformation equation relying on one coordinate transform technique. u and v are excitation currents supplied to the objective lens-correcting deflector lens 29. $\Delta x$ and $\Delta y$ are amounts of positional deviations at the excitation currents u and v, respectively. a to f are coordinate transform parameters.

The unknowns a to f can be calculated from six simultaneous equations obtained by substituting the above-described excitation current values $(u_1, v_1)$, $(u_2, v_2)$, $(u_3, v_3)$ and the amounts of positional deviations $(\Delta x_1, \Delta y_1)$, $(\Delta x_2, \Delta y_2)$, $(\Delta x_3, \Delta y_3)$ into Eq. (1). The calculated values of the unknowns a to f are substituted into Eq. (1).

Since the optimum values of excitation current to the objective lens-correcting deflector lens 29 bring the amounts of positional deviations of the underfocused and overfocused images to zero, the optimum values are the values of u and v assumed when $\Delta x$ and $\Delta y$ are set to zero, i.e., c and f. c corresponds to the optimum value of excitation in the X-direction of the objective lens-correcting deflector lens 29. f corresponds to the optimum value of excitation current in the Y-direction.

The optimum values (c, f) found in this way are sent from the control computer 34 to the lens control power supply 35, which, in turn, supplies excitation current values corresponding to the input optimum values to the objective lens-correcting deflector lens 29. As a result, the center axis of the electron beam is brought into coincidence with the center axis of the objective lens 15. Because of the operations described so far, correction of the axis of the objective lens 15 is completed.

The aforementioned method of a sequence of axial adjustments can be fully automatically implemented only if a button is depressed as long as initial conditions have been set. Furthermore, the sequence of axial adjustments may be automatically started at a set instant of time. Most of the time taken to execute the method of axial adjustments is spent in acquiring scanned images. It takes only a short time to perform the other operations. Consequently, the axial adjustments can be carried out quickly.

Moreover, axial adjustments of the aberration corrector can be automated roughly. This improves the rate of success of the present adjustments including fine adjustments. Hence, the axial adjustments can be made more accurately.

In the automated method of the axial adjustments for the aberration corrector, axial adjustment of each deflector lens is carried out repeatedly continuously plural times in order to improve the accuracy of the axial adjustments. This mode of operation can be set by the operator from the control portion (not shown) of the system.

Additionally, the axial adjustments can be carried out automatically when the time set by the operator has arrived. Further, the axial adjustments can be repeated automatically as many times as one wishes if the button for the present automatic axial adjustments is depressed.

The automatic axial adjustments may be carried out at the intervals of time set by the operator. The time required for the axial adjustments can be shortened.

When the axial adjustments of the aberration corrector are made, the rate of success of pattern matching can be enhanced by using a gold specimen. Furthermore, in the axial adjustments of the aberration corrector, the rate of success of pattern matching can be enhanced by using a circular pattern as the common pattern.

In addition, the rate of success of pattern matching during axial adjustments of the aberration corrector can be enhanced by using a crisscross pattern in the sample.

In the above embodiments, the present invention is applied to a scanning electron microscope equipped with an aberration corrector. The invention is not limited thereto. For example, the invention can be similarly applied to a semiconductor inspection system for inspecting either a pattern written on a semiconductor wafer or a semiconductor device for defects.

Having thus described my invention with the detail and particularity required by the Patent Laws, what is desired protected by Letters Patent is set forth in the following claims.

The invention claimed is:

1. An automatic method of axial adjustments for use in an electron beam system having: an electron beam source for producing an electron beam; a system of condenser lenses for focusing the electron beam produced from the electron beam source; an objective lens for focusing the electron beam onto a specimen; deflector lenses for scanning the electron beam over the specimen; aberration correction means having plural stages of combinations of electric or magnetic multipole lenses and electric-magnetic compound multipole lenses and acting to correct aberrations in the electron beam; a control power supply for supplying electric signals to the lenses; detection means for detecting electrons emanating from the specimen in response to the scanning; storage means for storing an output signal from the detection means as data about a scanned image; positional deviation computation means for calculating positional deviations of the image based on the data about the scanned image; and control means for calculating an optimum value of electric signal at which an orbit of the electron beam in the aberration correction means is brought into coincidence with a reference orbit based on the calculated positional deviations and sending an instruction to the control power supply such that an electric signal based on the calculated value is supplied to a multipole lens in the first stage of the aberration correction means, said automatic method of axial adjustments comprising the steps of:

calculating positional deviations of the image from scanned image data obtained whenever a different intensity of electric signal is supplied to multipole lenses in a stage which is included in said plural stages and whose center is passed through by the reference orbit when plural different electric signals are successively supplied to the multipole lens in the first stage;

calculating an optimum value of electric signal based on the electric signals supplied to the multipole lens in the first stage and on the calculated positional deviations; and supplying the optimum value of electric signal to the multipole lens in the first stage.

2. An automatic method of axial adjustments for use in an electron beam system having: an electron beam source for producing an electron beam; a system of condenser lenses for focusing the electron beam produced from the electron beam source; an objective lens for focusing the electron beam onto a specimen; an aperture disposed between the system of condenser lenses and the objective lens; condenser lens-correcting deflector lenses disposed above the aperture and acting to adjust an optical axis of the electron beam relative to a center axis of the system of condenser lenses and to scan the electron beam over the aperture; beam-deflecting lenses for scanning the electron beam over the specimen; aberration correction means having plural stages of combinations of electric or magnetic multipole lenses and electric-magnetic compound multipole lenses and acting to correct aberrations in the electron beam; a control power supply for supplying electric signals to the lenses; detection means for detecting electrons emanating from the specimen in response to the scanning; storage means for storing an output signal from the detection means as data about a scanned image; positional deviation computation means for calculating positional deviations of the image based on the data about the scanned image; and control means for calculating an optimum value of electric signal at which an orbit of the electron beam in the aberration correction means is brought into coincidence with a reference orbit based on the calculated positional deviations and sending an instruction to the control power supply such that an electric signal based on the calculated value is supplied to a multipole lens in the first stage of the aberration correction means, said automatic method of axial adjustments comprising the steps of:

calculating positional deviations of the image from scanned image data obtained whenever different intensities of electric signals are supplied to multipole lenses in a stage which is included in said plural stages and whose center is passed through by the reference orbit when plural different electric signals are successively supplied to a multipole lens in the first stage;

calculating an optimum value of electric signal based on the electric signals supplied to the multipole lens in the first stage and on the calculated positional deviations;

calculating positional deviations of the image from scanned image data obtained whenever plural different electric signals are supplied successively to the condenser lens-correcting deflector lenses and scanning the electron beam over the aperture;

calculating an optimum value of electric signal based on the electric signals supplied to the condenser lens-correcting deflector lenses and on the calculated positional deviations; and supplying the calculated optimum value of electric signal to the condenser lens-correcting deflector lenses.

3. An automatic method of axial adjustments for use in an electron beam system having: an electron beam source for producing an electron beam; a system of condenser lenses for focusing the electron beam produced from the electron beam source; an objective lens for focusing the electron beam onto a specimen; an objective lens-correcting deflector lens for adjusting an optical axis of the electron beam relative to a center axis of the objective lens; beam-deflecting lenses for scanning the electron beam over the specimen; aberration correction means having plural stages of combinations of electric or magnetic multipole lenses and electric-magnetic compound multipole lenses and acting to correct aberrations in the electron beam; a control power supply for supplying electric signals to the lenses; detection means for detecting electrons emanating from the specimen in response to the scanning; storage means for storing an output signal from the detection means as data about a scanned image; positional deviation computation means for calculating positional deviations of the image based on the data about the scanned image; and control means for calculating an optimum value of electric signal at which an orbit of the electron beam in the aberration correction means is brought into coincidence with a reference orbit based on the calculated positional deviations and sending an instruction to the control power supply such that an electric signal based on the calculated value is supplied to a multipole lens in the first stage of the aberration correction means, said automatic method of axial adjustments comprising the steps of:

calculating positional deviations of the image from scanned image data obtained whenever different intensities of electric signals are supplied to multipole lenses in a stage which is included in said plural stages and whose center is passed through by the reference orbit when plural different electric signals are successively supplied to the multipole lens in the first stage;

calculating an optimum value of electric signal based on the electric signals supplied to the multipole lens in the first stage and on the calculated positional deviations;

supplying the optimum value of electric signal to the multipole lens in the first stage;

calculating positional deviations of the image from scanned image data obtained whenever an electric signal for underfocusing and an electric signal for overfocusing are successively supplied to the objective lens when plural different electric signals are successively supplied to the objective lens-correcting deflector lens; and calculating an optimum value of electric signal based on the electric signals supplied to the objective lens-correcting deflector lens and on the calculated positional deviations and supplying the calculated optimum value of electric signal to the objective lens-correcting deflector lens.

4. An automatic method of axial adjustments for use in an electron beam system having: an electron beam source for producing an electron beam; a system of condenser lenses for focusing the electron beam produced from the electron beam source; an objective lens for focusing the electron beam onto a specimen; an aperture disposed between the system of condenser lenses and the objective lens; condenser lens-correcting deflector lenses disposed above the aperture and acting to adjust an optical axis of the electron beam relative to a center axis of the system of condenser lenses and to scan the electron beam over the aperture; an objective lens-correcting deflector lens for adjusting the optical axis of the electron beam relative to the center axis of the objective lens; beam-deflecting lenses for scanning the electron beam over the specimen; aberration correction means having plural stages of combinations of electric or magnetic multipole lenses and electric-magnetic compound multipole lenses and acting to correct aberrations in the electron beam; a control power supply for supplying electric signals to the lenses; detection means for detecting electrons emanating from the specimen in response to the scanning; storage means for storing an output signal from the detection means as data about a scanned image; positional deviation computation means for calculating positional deviations of the image based on the data about the scanned image; and control means for calculating an optimum value of electric signal at which an orbit of the electron beam in the aberration correction means is brought into coincidence with a reference orbit based on the calculated positional deviations and sending an instruction to the control power supply such that an electric signal based on the calculated value is supplied to a multipole lens in the first stage of the aberration correction means, said automatic method of axial adjustments comprising the steps of:

calculating positional deviations of the image from scanned image data obtained whenever different intensities of electric signals are supplied to multipole lenses in a stage which is included in said plural stages and whose center is passed through by the reference orbit when plural different electric signals are successively supplied to the multipole lens in the first stage;

calculating an optimum value of electric signal based on the electric signals supplied to the multipole lens in the first stage and on the calculated positional deviations;

supplying the optimum value of electric signal to the multipole lens in the first stage;

calculating positional deviations of the image from scanned image data obtained whenever plural different electric signals are successively supplied to the condenser lens-correcting deflector lens and the electron beam is scanned over the aperture;

calculating an optimum value of electric signal based on the electric signals supplied to the condenser lens-correcting deflector lens and on the calculated positional deviations and supplying the electric signal to the condenser lens-correcting deflector lens;

calculating positional deviations of the image from scanned image data obtained when an electric signal for underfocusing and an electric signal for overfocusing are successively supplied to the objective lens whenever plural different electric signals are successively supplied to the objective lens-correcting deflector lens; and calculating an optimum value of electric signal based on the electric signals supplied to the objective lens-correcting deflector lens and on the calculated positional deviations and supplying the calculated optimum value of electric signal to the objective lens-correcting deflector lens.

5. An automatic method of axial adjustments for use in an electron beam system as set forth in any one of claims 1 to 4, wherein said step of calculating an optimum value of electric signal is repeated until the calculated optimum value of signal becomes smaller than a reference level.

6. An automatic method of axial adjustments for use in an electron beam system as set forth in claim 5, wherein the number of repetitions can be set by an operator.

7. An automatic method of axial adjustments for use in an electron beam system as set forth in any one of claims 1 to 4, wherein said axial adjustments are started when a specified time arrives.

8. An automatic method of axial adjustments for use in an electron beam system as set forth in any one of claims 1 to 4, wherein said axial adjustments are started by depressing a switch.

9. An automatic method of axial adjustments for use in an electron beam system as set forth in any one of claims 1 to 4, wherein said specimen is made of gold.

\* \* \* \* \*